(12) United States Patent
Gong

(10) Patent No.: US 8,841,937 B2
(45) Date of Patent: Sep. 23, 2014

(54) ANALOG SAMPLE CIRCUIT WITH SWITCH CIRCUIT

(76) Inventor: Chuan Gong, Beijing (CN)

(*) Notice: Subject to any disclaimer, the term of this patent is extended or adjusted under 35 U.S.C. 154(b) by 0 days.

(21) Appl. No.: 13/336,952

(22) Filed: Dec. 23, 2011

(65) Prior Publication Data

US 2013/0162299 A1  Jun. 27, 2013

(51) Int. Cl.
*G11C 27/02* (2006.01)
(52) U.S. Cl.
USPC .......................... 327/94; 327/337; 341/122
(58) Field of Classification Search
USPC ............ 327/91–96, 337, 554; 341/122–125
See application file for complete search history.

(56) References Cited

U.S. PATENT DOCUMENTS 4,329,599 A * 5/1982 Gregorian et al. ............ 327/554
5,644,257 A * 7/1997 Kerth et al. ..................... 327/96

* cited by examiner

*Primary Examiner* — William Hernandez
(74) *Attorney, Agent, or Firm* — Zareefa B. Flener; Flener IP Law

(57) ABSTRACT

Techniques pertaining to an analog sample circuit are disclosed. One embodiment of the analog sample circuit shows characteristics of low distortion and high linearity, which can be used in many circuits including integrated circuits (IC). In a switch circuit or an analog sample circuit of one embodiment, a constant voltage module is configured to stabilize the gate-source voltage of the PMOSFET switch as the sample switch, so that the gate-resource voltage of the PMOSFET switch doesn't vary with the input signal Vin; a switch circuit is configured to ensure that the switch circuit or the analog sample circuit is capable of processing the input signal lower than a minimum voltage in the circuit.

5 Claims, 4 Drawing Sheets

ANALOG SAMPLE CIRCUIT WITH SWITCH CIRCUIT

BACKGROUND OF THE INVENTION

1. Field of the Invention

The invention relates to the field of electronic technique, particularly to an analog sample circuit with a switch circuit.

2. Description of Related Art

A switch capacitor circuit mainly includes a plurality of switch circuits controlled by corresponding clock signals and one or more capacitor and realizes various processes to electric signal by storing and transferring charge. In the practical circuit, the switch capacitor circuit mainly consisting of the switch circuits and the capacitor can't meet the requirement sometimes. Hence, the switch capacitor circuit usually combines with an amplifier, an operational amplifier or a comparator to realize generation, transformation and process of the electric signal.

A sampling hold circuit in a conventional analog sample circuit realizes various processes to the electric signal by using a Metal Oxide Semiconductor switch capacitor circuit usually. FIG. 1 is a circuit diagram exemplary showing a conventional analog sample circuit. Commonly, a chip in a standard CMOS (Complementary Metal Oxide Semiconductor) process has a minimum operating voltage of 0V and different maximum operating voltages (e.g. 1.8V, 2.5V, 3.3V, or 5V etc., 5V is used as the maximum operating voltage hereafter for simplicity) according to different processes. Referring to FIG. 1, the conventional analog sample circuit comprises four switch circuits SW1, SW2, SW3 and SW4, two capacitors Cs and Cint, and an operational amplifier A1. The circuit consisting of the switch circuits SW1, SW2, SW3 and SW4 and the capacitors Cs and Cint is the switch capacitor circuit mentioned above. A reference voltage REF is set to be half of the maximum operating voltage, namely 2.5V, for maximum signal amplitude. The reference voltage REF is also referred as a common mode voltage which is a middle voltage value for full differential signal. The common mode voltage is usually set to half of the maximum operating voltage for maximum signal amplitude. Clock signals driving the analog sample circuit is also shown in FIG. 1.

In operation, the switch circuits SW1 and SW3 turn on, the switch circuits SW2 and SW4 turn off, an input signal VIN is sampled by the capacitor Cs, and the capacitor Cint remains unchanged when the clock signal PH1 is high level "1" (5V). The switch circuits SW1 and SW3 turn off, the switch circuits SW2 and SW4 turn on, and the input signal is transferred from the capacitor Cs to the capacitor Cint for integration when the clock signal PH2 is high level "1". The reference voltage REF is the common mode voltage of the input signal, so it is set to be 2.5V. The clock signal PH1 and the clock signal PH2 are a pair of non-overlapping clock signals.

In practical application, if the common mode voltage of the input signal is 0V, the analog sampling circuit may not work properly. The sample switch circuit of the analog sampling circuit in CMOS process is made up of single P-channel Metal Oxide Semiconductor Field Effect Transistor (PMOSFET), single N-channel Metal Oxide Semiconductor Field Effect Transistor (NMOSFET), or a pair of complementary PMOSFET and NMOSFET. If the common mode voltage of the input signal is 0V, the sample switch circuit made up of the PMOSFET doesn't turn on properly to sample the input signal because a gate-source voltage Vgs of the PMOSFET is larger than a threshold voltage Vth of the PMOSFET when a voltage of the input signal is less than 0V. If the common mode voltage of the input signal is 0V, the sample switch circuit made up of the NMOSFET also doesn't work properly because a PN junction of the NMOSFET is biased.

In order to solve the problem, a bias circuit is provided to generate a control level signal. The sample switch circuit turns on and off according to the control level signal. Thus, the analog signal lower than a minimum voltage in the circuit can be sampled properly. For example, FIG. 2 shows a circuit for sampling analog signal lower than a minimum voltage in the circuit disclosed in a Chinese patent published on May 16, 2007 with a publication number CN1964197A. Referring to FIG. 2, a turn-on voltage of the sample switch circuit is Vgs=Va−Vdd−Vin(n). For another example, FIG. 3 shows an analog sample circuit disclosed in a Chinese patent published on Jul. 26, 2006 with a publication number CN1266842C. Referring to FIG. 3, the turn-on voltage of the sample switch circuit is Vgs=Vin(n−1)−Vdd−Vin(n).

The turn-on voltage (namely the gate-source voltage Vgs) of the sample switch circuit is correlative to the input signal and changes with the input signal. As a result, an on resistance of the sample switch circuit also changes with the input signal. Thereby, the sampled signal may be distorted, and a high linear sample can't be realized.

Therefore, improved techniques for the analog sample circuit are desired to be provided to solve above problems.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Commonly, a PMOS transistor is provided to sample a low voltage input signal, and an operating voltage of a gate of the PMOS transistor is nearly 0V. A gate-source voltage Vgs of the PMOS transistor is larger than a threshold voltage Vthp of the PMOS transistor which is a negative value when the voltage of the input signal is less than 0V. At this time, the PMOS transistor cannot be turned on properly. Hence, a circuit is configured to generate a gate voltage of the PMOS transistor which is lower than a voltage of a negative electrode of a power supply to ensure Vgs<Vthp. Thus, the PMOS transistor can turn on properly to sample the input signal.

The basic requirement for a sampled signal is low distortion and high linearity. An on resistance of the PMOS transistor as a sample switch circuit needs to remain unchanged in a sample cycle. The on resistance of the PMOS transistor is in inverse proportion to the gate-source voltage Vgs of the PMOS transistor. In the conventional analog sample circuit, the gate voltage of the PMOS transistor as the sample switch circuit is equal to a voltage of the power supply (0 or VDD) which is constant, but a source voltage of the PMOS transistor as the sample switch circuit is equal to a voltage of the input signal which isn't constant. Thus, the gate-source voltage of the PMOS transistor changes with the input signal, so the on resistance of the PMOS transistor also changes with the input signal. For high linearity and low distortion, the gate voltage of the PMOS transistor is configured to vary with the input signal. Thereby, the on resistance of the PMOS transistor remains unchanged and has no relation with the input signal.

Figure 1:
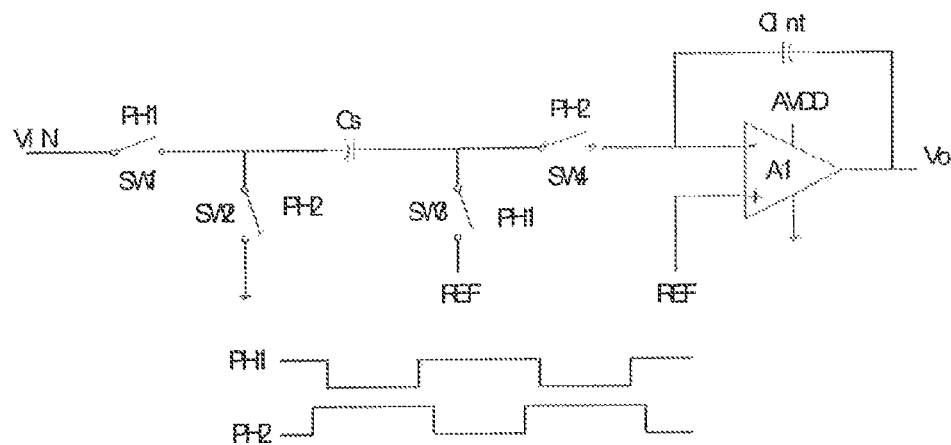
FIG. 1 is a schematic circuit diagram showing a conventional analog sample circuit.
Figure 2:
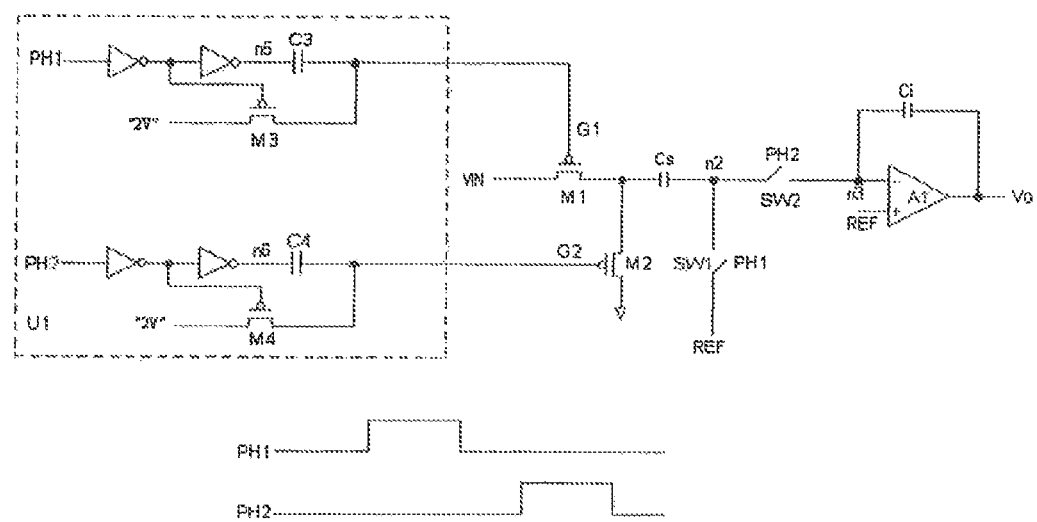
FIG. 2 is a schematic circuit diagram showing a conventional circuit for sampling analog signal lower than a minimum voltage in the circuit.
Figure 3:
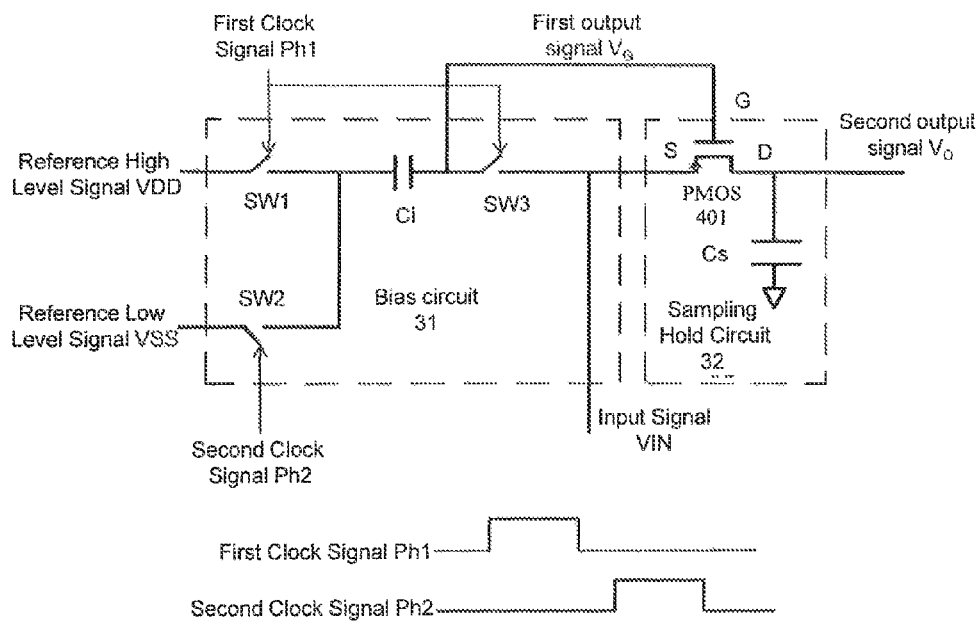
FIG. 3 is a schematic circuit diagram showing another conventional analog sample circuit.
Figure 4:
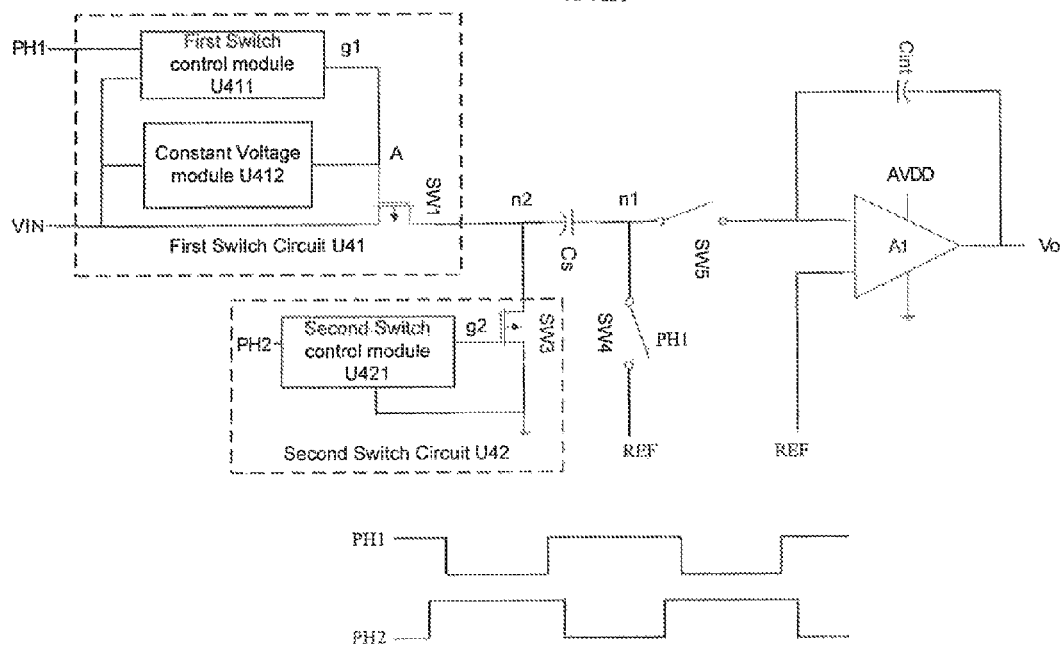
FIG. 4 is a schematic circuit diagram showing an analog sample circuit according to one embodiment of the present invention.

FIG. 4 is a schematic circuit diagram showing an analog sample circuit according to one embodiment of the present invention. The analog sample circuit comprises a fourth switch circuit SW4, a fifth switch circuit SW5, a sample capacitor Cs, an integration capacitor Cint and an operational amplifier A1.

The fourth switch circuit SW4 controlled by a first clock signal PH1 has one terminal coupling to a first node n1 and another terminal coupling to a reference voltage REF.

The fifth switch circuit SW5 controlled by a second clock signal PH2 has one terminal coupling to the first node n1 and another terminal coupling to an inverse input terminal of the operational amplifier A1. A non-inverse input terminal of the operational amplifier A1 is coupled to the reference voltage REF. The integration capacitor Cint is coupled between the inverse input terminal and an output terminal of the operational amplifier A1. The sample capacitor Cs is coupled between the first node n1 and a second node n2.

The analog sample circuit further comprises a first switch circuit U41 and a second switch circuit U42.

The first switch circuit U41 comprises a first switch control module U411 coupled between a third node A and an input signal VIN, a constant voltage module U412 coupled between the third node A and the input signal VIN, and a first PMOSFET switch SW1 having a source coupling to the input signal VIN, a drain coupling to the second node n2 and a gate coupling to the third node A. The first switch control module U411 outputs a first switch signal g1 to the third node A under the control of the first clock signal PH1. The first PMOSFET switch SW1 turns on and off under the control of the first switch signal g1. The constant voltage module U412 generates a constant voltage as a gate-source voltage of the first PMOSFET switch SW1 when the first PMOSFET switch SW1 turns on under the control of the first switch signal g1.

The second switch circuit U42 comprises a third PMOSFET switch SW3 having a source coupling to a ground, a drain coupling to the second node n2 and a gate, and a second switch control module U421 coupled between the gate of the third PMOSFET switch SW3 and the ground. The second switch control module U421 outputs a second switch signal g2 to the gate of the third PMOSFET switch SW3 under the control of the second clock signal PH2. The third PMOSFET switch SW3 turns on and off under the control of the second switch signal g2.

The first clock signal PH1 and the second clock signal PH2 for driving the analog sample circuit are also shown in FIG. 4. An operating principle of the analog sample circuit shown in FIG. 4 is described in detail hereafter.

The first switch circuit U41 and the fourth switch circuit SW4 are controlled by the first clock signal PH1, and the input signal VIN is inputted into the first switch circuit U41. In a period of time of the first clock signal PH1, the fourth switch circuit SW4 turns on, and the first switch circuit U41 outputs the input signal VIN to the second node n2. At this time, the input signal VIN at the second node n2 is sampled by the sample capacitor Cs if the third PMOSFET switch SW3 of the second switch circuit U42 and the fifth switch circuit SW5 turn off. In another period of time of the first clock signal PH1, the fourth switch circuit SW4 turns off, and the first switch circuit U41 doesn't output the input signal VIN to the second node n2. At this time, a signal sampled by the sample capacitor Cs is transferred to the integration capacitor Cint.

When the input signal Vin is sampled, the first switch control module U411 outputs the first switch signal g1 to the third node A under the control of the first clock signal PH1 in corresponding period of time. The constant voltage module U412 generates a constant voltage between the third node A and the source of the first PMOSFET switch SW1 when the first PMOSFET switch SW1 turns on according to the first switch signal g1. The constant voltage is the voltage between the gate and the source of the first PMOSFET switch SW1, and also referred as the turn-on voltage of the first PMOSFET switch SW1. An on resistance of the first PMOSFET switch SW1 is constant because the turn-on voltage is constant.

The second switch circuit U42 and the fifth switch circuit SW5 are controlled by the second clock signal PH2. In a period of time of the second clock signal PH2, the fifth switch circuit SW5 turns off, the second switch control module U421 of the second switch circuit U42 outputs the second switch signal g2 to turn off the third PMOSFET switch SW3, and a voltage on the integration capacitor Cint remains unchanged. In another period of time of the second clock signal PH2, the fifth switch circuit SW5 turns on, the second switch control module U421 outputs the second switch signal g2 to turn on the third PMOSFET switch SW3, the signal sampled by the sample capacitor Cs is transferred to the integration capacitor Cin if the first PMOSFET switch SW1 and the fourth switch circuit SW4 both turn off. Thus, the integration capacitor Cint integrates the signal from the sample capacitor Cs to get an output voltage Vout, wherein Vout=Cs/Cint*Vin.

It can be seen that the analog sample circuit provided in the present invention is able to sample analog signal lower than a minimum voltage in the circuit. Furthermore, the analog sample circuit provided in the present invention can realize high linear sampling because the on resistance of the first PMOSFET switch SW1 is constant and doesn't vary with the input signal VIN.

The analog sample circuit provided in the present invention is further described hereafter for further understanding.

Figure 5:
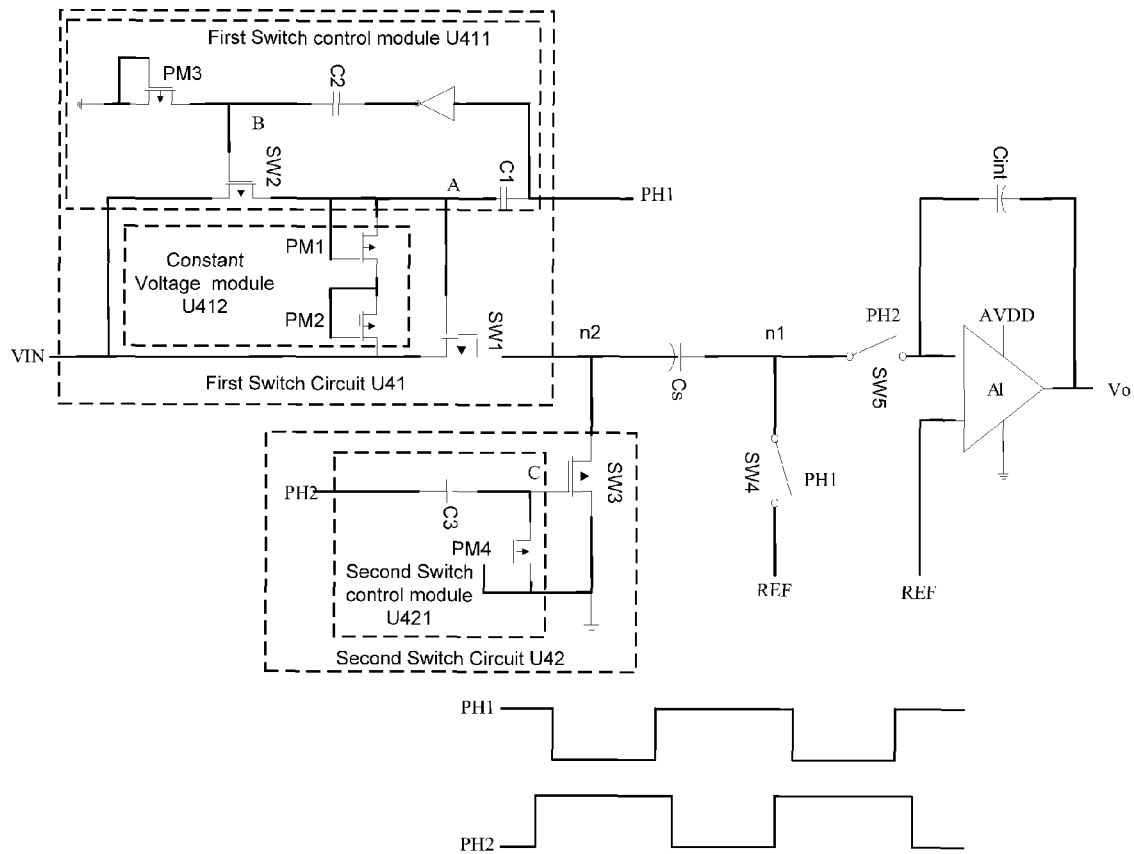
FIG. 5 is a schematic circuit diagram showing the analog sample circuit according to a preferred embodiment of the present invention.

FIG. 5 is a schematic circuit diagram showing the analog sample circuit according to a preferred embodiment of the present invention. Referring to FIG. 5, the constant voltage module U412 comprises a first PMOSFET PM1 and a second PMOSFET PM2. The first PMOSFET PM1 has a gate, a drain both coupling to the third node A and a source. The second PMOSFET PM2 has a gate, a drain both coupling to the source of the first PMOSFET PM1 and a source coupling to the input signal VIN.

Generally, one MOS transistor functions as a diode if the gate and the drain of the MOS transistor are coupled to each other. This connection method of the MOS transistor is referred as diode connection.

In the preferred embodiment, the first switch control module U411 comprises a third PMOSFET PM3, a first capacitor C1, a second capacitor C2, a second PMOSFET switch SW2 and an inverter.

The inverter has an input terminal coupling to the first clock signal PH1 and an output terminal coupling to one terminal of the second capacitor C2. Another terminal of the second capacitor C2 is coupled to a drain of the third PMOSFET PM3. A gate and a source of the third PMOSFET PM3 both are grounded. The first capacitor C1 has one terminal coupling to the first clock signal PH1 and another terminal coupling to the third node A. The second PMOSFET switch SW2 has a drain coupling to the third node A, a source coupling to the input signal VIN and a gate coupling to a node between the second capacitor C2 and the third PMOSFET PM3.

In the preferred embodiment, the second switch control module U421 comprises a third capacitor C3 and a fourth PMOSFET PM4. The third capacitor C3 has one terminal coupling to the second clock signal PH2 and another terminal coupling to the gate of the third PMOSFET switch SW3. The fourth PMOSFET PM4 has a gate, a source both grounded and a drain coupling to the gate of the third PMOSFET switch SW3.

In the preferred embodiment, the first PMOSFET PM1 and the second PMOSFET PM2 are provided to stabilize the gate-source voltage Vgs of the first PMOSFET switch SW1, wherein Vgs=−2Vth, and Vth is a threshold voltage of the PMOSFET which is constant. The first switch control module U411 is provided to turn on or off the first PMOSFET switch SW1. The second switch control module U421 is provided to turn on or off the third PMOSFET switch SW3.

An operating principle of the second switch control module U421 is described hereafter. In order to facilitate analysis, the charge on the third capacitor C2 is set to 0 before the analog sample circuit works. A voltage of a node C shown in FIG. 5 (namely the gate of the third PMOSFET switch SW3) becomes "1" because the charge on the third capacitor C2 can't change suddenly when the second clock signal PH2 just becomes "1" from "0". At this moment, the fourth PMOSFET PM4 turns on, and then the voltage of the node C is clamped to Vth finally. The voltage drop on the third capacitor C3 is (Vdd−Vth). In this state, the third PMOSFET switch SW3 turns off. The voltage of the node C becomes (Vth−Vdd) because the charge on the third capacitor C2 can't change suddenly when the second clock signal PH2 just becomes "0" from "1". At this time, the fourth PMOSFET PM4 turns off and the third PMOSFET switch SW3 turns on.

An operating principle of the first switch control module U411 is similar to that of the second switch control module U421. A voltage of the third node A shown in FIG. 5 (namely the gate of the first PMOSFET switch SW1) is Vin(n−1) and a voltage drop on the first capacitor C1 is (Vdd−Vin(n−1)) when the first clock signal PH1 becomes "1" from "0". The second PMOSFET switch SW2 turns off when the first clock signal PH1 becomes "0" from "1". At the moment that the first clock signal PH1 just becomes "0", the voltage of the third node A becomes (Vin(n−1)−Vdd). Then, the first PMOSFET PM1 and the second PMOSFET PM2 both turn on, the voltage of the third node A is clamped to (Vin(n)−2Vth) finally, and the first PMOSFET switch SW1 turns on. Thus, the gate-source voltage Vgs of the first PMOSFET switch SW1 is Vgs=Vin(n)−2Vth−Vin(n)=−2Vth which is constant.

It can be seen that the on resistance of the first PMOSFET switch SW1 is constant and doesn't vary with the input signal VIN because the gate-source voltage Vgs of the first PMOSFET switch SW1 is constant. Thus, the analog input signal is sampled with high linearity. Additionally, the analog sample circuit is capable of sampling the analog input signal lower than a minimum voltage in the circuit because the first switch control module U411 generates the voltage signal which is able to turn on the first PMOSFET switch SW1 and the second switch control module U421 generates the voltage signal which is able to turn on the third PMOSFET switch SW3.

A switch circuit according to one embodiment of the present invention is described in detail hereafter. The switch circuit usually uses MOS process which has the advantages of simple process and easy large-scale integration and is widely used in various integrated circuits such as a filter circuit, an integrating circuit and a sample circuit etc. At present, the accuracy of signal process in the integrated circuit is highly demanded more and more. Hence, the performance especially linearity of the switch circuit is highly demanded more and more. Additionally, the switch circuit is demanded to be capable of processing the input signal lower than a minimum voltage in the circuit sometimes.

The switch circuit provided in the present invention comprises a constant voltage module and a switch control module. The constant voltage module is configured to stabilize a gate-source voltage of a PMOSFET switch as a sample switch. So, an on resistance of the sample switch is constant. Thereby, the whole switch circuit has high linearity in signal sampling. The switch control module is configured to ensure that the switch circuit is capable of processing the input signal lower than a minimum voltage in the circuit.

Figure 6:
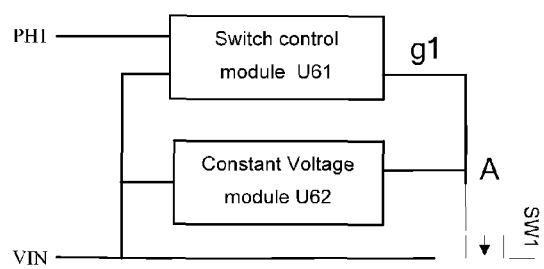
FIG. 6 is a schematic circuit diagram showing a switch circuit according to one embodiment of the present invention.

FIG. 6 is a schematic circuit diagram showing the switch circuit according to one embodiment of the present invention. The switch circuit comprises a switch control module U61, a constant voltage module U62 and a first PMOSFET switch SW1. The switch control module U61 is coupled between a third node A and an input signal VIN, and outputs a first switch signal g1 to the third node A under the control of a first clock signal PH1. The constant voltage module U62 is coupled between the third node A and the input signal VIN, and generates a constant voltage as a gate-source voltage of the first PMOSFET switch SW1 when the first PMOSFET switch SW1 turns on under the control of the first switch signal PH1. The first PMOSFET switch SW1 has a source coupling to the input signal VIN, a drain as an output terminal and a gate coupling to the third node A, and switches on and off under the control of the first switch signal PH1.

The switch control module U61 outputs the first switch signal g1 to the third node A to turn on and off the first PMOSFET switch SW1 under the control of the first clock signal PH1. The constant voltage module U62 generates a constant voltage between the third node A and the source of the first PMOSFET switch SW1 when the first PMOSFET switch SW1 turns on according to the first switch signal g1. The constant voltage is the voltage between the gate and the source of the first PMOSFET switch SW1, and also referred as the turn-on voltage of the first PMOSFET switch SW1. An on resistance of the first PMOSFET switch SW1 is constant because the turn-on voltage is constant.

Figure 7:
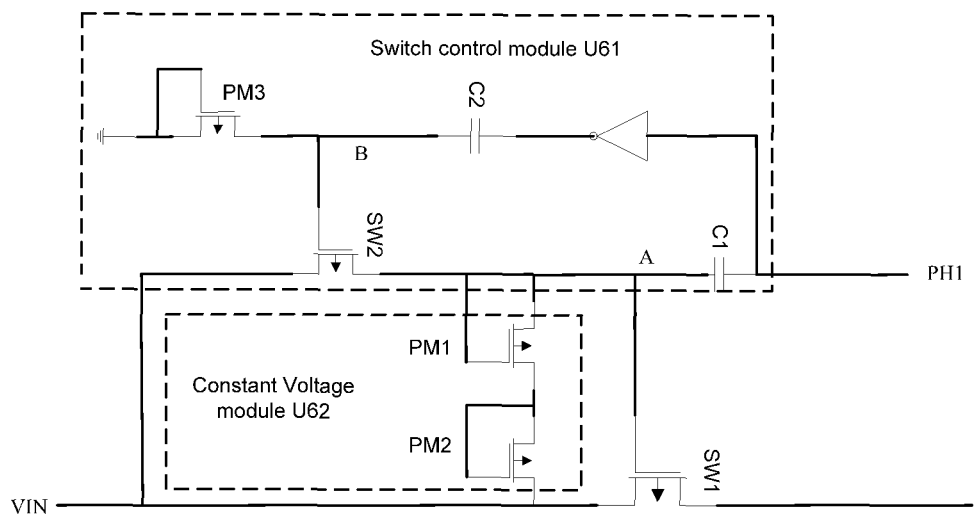
FIG. 7 is a schematic circuit diagram showing the switch circuit according to a preferred embodiment of the present invention.

FIG. 7 is a schematic circuit diagram showing the switch circuit according to a preferred embodiment of the present invention. In the preferred embodiment, the constant voltage module U61 comprises a first PMOSFET PM1 and a second PMOSFET PM2. The first PMOSFET PM1 has a gate, a drain both coupling to the third node A and a source. The second PMOSFET PM2 has a gate, a drain both coupling to the source of the first PMOSFET PM1 and a source coupling to the input signal VIN.

In the preferred embodiment, the switch control module U61 comprises a third PMOSFET PM3, a first capacitor C1, a second capacitor C2, a second PMOSFET switch SW2 and an inverter. The inverter has an input terminal coupling to the first clock signal PH1 and an output terminal. The first capacitor C1 has one terminal coupling to the first clock signal PH1 and another terminal coupling to the third node A. The second capacitor C2 has one terminal coupling to the output terminal of the inverter and another terminal coupling to a drain of the third PMOSFET PM3. A gate and a source of the third PMOSFET both are grounded. The second PMOSFET switch SW2 has a drain coupling to the third node A, a source coupling to the input signal VIN and a gate coupling to a node between the second capacitor C2 and the third PMOSFET PM3.

In conclusion, the constant voltage module of the switch circuit or the analog sample circuit in the present invention is configured to stabilize the gate-source voltage of the PMOSFET switch as the sample switch so that the gate-source voltage of the PMOSFET switch doesn't vary with the input signal Vin. Hence, the on resistance of the PMOSFET switch is constant. Thereby, the whole switch circuit or the analog sample circuit has high linearity in signal sampling. The switch control module of the switch circuit or the analog sample circuit in the present invention is configured to ensure that the switch circuit or the analog sample circuit is capable of processing the input signal lower than a minimum voltage in the circuit.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. An analog sample circuit, comprising:
    an operational amplifier having a non-inverse input terminal coupling to a reference voltage, an inverse input terminal and an output terminal;
    an integration capacitor coupled between the inverse input terminal and the output terminal of the operational amplifier;
    a switch circuit having one terminal coupling to a first node and another terminal coupling to the reference voltage and controlled by a first clock signal;
    a fifth switch circuit having one terminal coupling to the first node and another terminal coupling to the inverse input terminal of the operational amplifier and controlled by a second clock signal;
    a sample capacitor coupled between the first node and a second node;
    a first switch circuit comprising a first switch control module coupled between a third node and an input signal, a constant voltage module coupled between the third node and the input signal and a first PMOSFET switch having a source coupling to the input signal, a drain coupling to the second node and a gate coupling to the third node, the first switch control module outputting a first switch signal to the third node under the control of the first clock signal, the constant voltage module generating a constant voltage as a gate-source voltage of the first PMOSFET switch when the first PMOSFET switch turns on under the control of the first switch signal, arid the first PMOSFET switch turning on and off under the control of the first switch signal; and
    a second switch circuit comprising a third PMOSFET switch having a source coupling to a ground, a drain coupling to the second node and a gate, and a second switch control module coupled between the gate of the third PMOSFET switch and the ground, the second switch control module outputting a second switch signal to the gate of the third PMOSFET switch under the control of the second clock signal, and the third PMOSFET switch turning on and off under the control of the second switch signal.

2. The analog sample circuit according to claim 1, wherein the constant voltage module comprises:
    a first PMOSFET switch having a gate, a drain both coupling to the third node and a source, and
    a second PMOSFET switch having a gate, a drain both coupling to the source of the first PMOSFET switch and a source coupling to the input signal.

3. The analog sample circuit according to claim 1, wherein the first switch control module comprises:
    an inverter having an input terminal coupling to the first clock signal and an output terminal;
    a first capacitor having one terminal coupling to the first clock signal and another terminal coupling to the third node;
    a second capacitor having one terminal coupling to the output terminal of the inverter;
    a third PMOSFET switch having a gate, a source both grounded and a drain coupled to another terminal of the second capacitor; and
    a second PMOSFET switch having a drain coupling to the third node, a source coupling to the input signal and a gate coupling to a node between the second capacitor and the third PMOSFET switch.

4. The analog sample circuit according to claim 1, wherein an on resistance of the first PMOSFET switch is constant because the constant voltage module generates the constant voltage as the gate-source voltage of the first PMOSFET switch when the first PMOSFET switch turns on under the control of the first switch signal.

5. The analog sample circuit according to claim 1, wherein the second switch control module comprises:
    a third capacitor having one terminal coupling to the second clock signal and another terminal coupling to the gate of the third PMOSFET switch;
    a fourth PMOSFET switch having a gate, a source both grounded and a drain coupling to the gate of the third PMOSFET switch.

* * * * *